United States Patent
Huijsing et al.

(10) Patent No.: US 7,535,295 B1
(45) Date of Patent: May 19, 2009

(54) CHOPPER STABILIZED AMPLIFIERS COMBINING LOW CHOPPER NOISE AND LINEAR FREQUENCY CHARACTERISTICS

(75) Inventors: Johan Hendrik Huijsing, Schipluiden (NL); Kofi Anthony A. Makinwa, Delft (NL); Johan Frederik Witte, Delft (NL)

(73) Assignee: Maxim Integrated Products, Inc., Sunnyvale, CA (US)

( * ) Notice: Subject to any disclaimer, the term of this patent is extended or adjusted under 35 U.S.C. 154(b) by 68 days.

(21) Appl. No.: 11/855,461

(22) Filed: Sep. 14, 2007

Related U.S. Application Data (60) Provisional application No. 60/844,734, filed on Sep. 15, 2006.

(51) Int. Cl.
*H03F 1/02* (2006.01)
(52) U.S. Cl. .......................... 330/9; 327/124
(58) Field of Classification Search ............. 330/9; 327/124, 307
See application file for complete search history.

(56) References Cited

U.S. PATENT DOCUMENTS

| | | |
|---|---|---|
| 4,559,502 A | 12/1985 | Huijsing |
| 6,734,723 B2 * | 5/2004 | Huijsing et al. ............... 330/9 |
| 7,132,883 B2 | 11/2006 | Huijsing et al. |
| 7,209,000 B2 * | 4/2007 | Huijsing et al. ............... 330/9 |
| 2006/0176108 A1 | 8/2006 | Huijsing et al. |

OTHER PUBLICATIONS

Bernard J. van den Dool et al., "Indirect Current Feedback Instrumentation Amplifier with a Common-Mode Input Range that Includes the Negative Rail", IEEE Journal of Solid-State Circuits, Jul. 1993, vol. 28, No. 7, pp. 743-749.

* cited by examiner

*Primary Examiner*—Henry K Choe
(74) *Attorney, Agent, or Firm*—Blakely Sokoloff Taylor & Zafman LLP (57) ABSTRACT

Chopper stabilized amplifiers combining low clock noise and linear frequency characteristics. The chopper stabilized amplifiers are used in offset correction circuitry, with the output of the chopper stabilized amplifiers being integrated by an integrator. The integrator operates on alternate cycles, with a sample and hold circuit sampling the integrator output when the integrator is not integrating, with the output of the sample and hold being coupled to the main amplification path to cancel offset after at least some amplification is achieved. Autozeroing of amplifiers in the offset correction circuitry is also disclosed. The invention is applicable to operational amplifiers and instrumentation amplifiers.

21 Claims, 12 Drawing Sheets

Oscillator

Chopper

Integrator and (not az gm7gm8)

Integrator out

SH

Integrator Cap

Integrator AZ

CHOPPER STABILIZED AMPLIFIERS COMBINING LOW CHOPPER NOISE AND LINEAR FREQUENCY CHARACTERISTICS

CROSS-REFERENCE TO RELATED APPLICATION

This application claims the benefit of U.S. Provisional Patent Application No. 60/844,734 filed Sep. 15, 2006.

BACKGROUND OF THE INVENTION

1. Field of the Invention

The present invention relates to the field of chopper stabilized operational and instrumentation amplifiers.

2. Prior Art

Chopper stabilized operational and instrumentation amplifiers are well known in the prior art. In a typical operational amplifier, the signal amplification path includes a plurality of cascaded amplifiers, or stages of amplification defining the signal path. If the amplifier input were shorted, the input offset primarily of the first amplifier or stage would be amplified, typically to saturate the output of the operational amplifier. When used in a feedback circuit, this does not happen, but instead the input offset causes the input to the amplifier to effectively be equal to the actual input to the circuit shifted by an amount equal to the input offset. Ideally, with a very high DC gain in the signal path, the input to an operational amplifier circuit in a feedback application will be very near zero, substantially independent of the operational amplifier output.

The input offset of integrated circuit operational amplifiers is reasonably low and satisfactory for many applications, but not the higher precision applications. Using an operational amplifier as an example, in the prior art, in order to cancel at least part of the input offset, the input of a chopper amplifier is also coupled to the amplifier input, with the output of the chopper amplifier being integrated and the output of the integrator being combined with the signal in the signal path after at least some signal path amplification. Since the main contributor of offset in the signal path is the input or first amplifier in the cascaded amplifiers, injection of the offset correction after at least the first stage of the cascaded amplifiers substantially reduces the effective input offset of the cascaded amplifiers in the signal path. If the gain of the chopper amplifier path is high, it will even cancel the offset of cascaded stages following that input stage. The chopper amplifier (input and output choppers enclosing an amplifier) converts the input offset to AC by the input chopper and amplifies the AC, with the output chopper operating at the same frequency reconverting AC to DC responsive to the input offset in the signal path for integration and then injection into the signal path. The net effect is that any input offset of the cascaded amplifiers defining the signal path results in an input to the integrator, which integrates the input offset and injects a DC result into the signal path to drive and maintain the input offset of the cascaded amplifiers substantially at zero. This is a substantial improvement in input offset of higher precision operational amplifiers and instrumentation amplifiers.

However, there are various other sources of offset as well as sources of noise in such a configuration. Not only is offset undesirable because of its effect on accuracy, but also chopper induced noise is undesirable, and may cause problems especially in systems capable of responding to such frequencies or whose performance is degraded by noise in the system.

BRIEF DESCRIPTION OF THE DRAWINGS

FIG. 5a illustrates a 12 dB roll-off at low frequencies.

FIG. 5b illustrates the elimination of the 12 dB roll-off at low frequencies of FIG. 5a.

FIG. 6 illustrates the effect of parasitic capacitance in the chopper input offset correction path.

FIG. 9 is an exemplary timing diagram for the embodiment of FIG. 7a.

DETAILED DESCRIPTION OF THE PREFERRED EMBODIMENTS

The low-offset instrumentation amplifier designs of the present invention contain a technique that combines chopper-noise suppression with a linear (in dB) frequency characteristic. The technique uses a sample-and-hold circuit to reduce the chopper-ripple-noise, the noise being the result of the offset of the chopper sense amplifier which is not fully suppressed by the integrator behind it. This sample and hold circuit is embedded in a frequency-compensation topology in a way that ensures a linear 6 dB/oct roll-off (see U.S. Patent Application Publication No. 2006/0176108 entitled "Frequency Stabilization of Chopper-Stabilized Amplifiers", assigned to the assignee of the present invention, the disclosure of which is hereby incorporated by reference).

This technique of chopper-noise suppression can be generally applied in low-offset chopper-stabilized operational amplifiers, instrumentation amplifiers, and sense amplifiers.

Topology Overview

Figure 1:
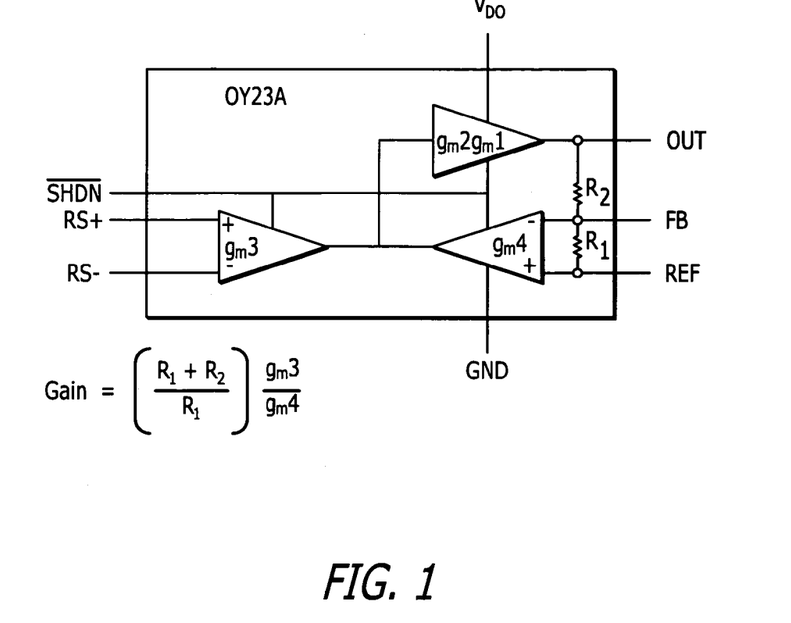
FIG. 1 is block diagram of a current mode instrumentation amplifier (CMIA) which may incorporate the present invention.

One embodiment is a current mode instrumentation amplifier (CMIA). The key application is high side current sense amplifier as shown in FIG. 1.

Design challenges for an exemplary application:

Low offset voltage

High CMRR+accuracy+bandwidth⇒CMIA

Gain depends on R1 and R2⇒gm3=gm4⇒matching

Figure 2:
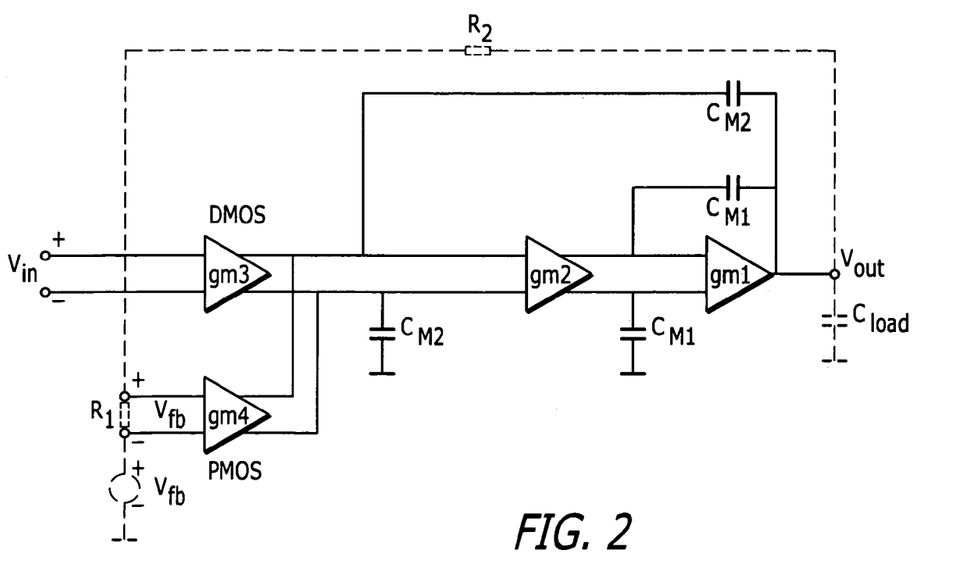
FIG. 2 illustrates a three stage amplifier topology which may incorporate the present invention.
Figure 3:
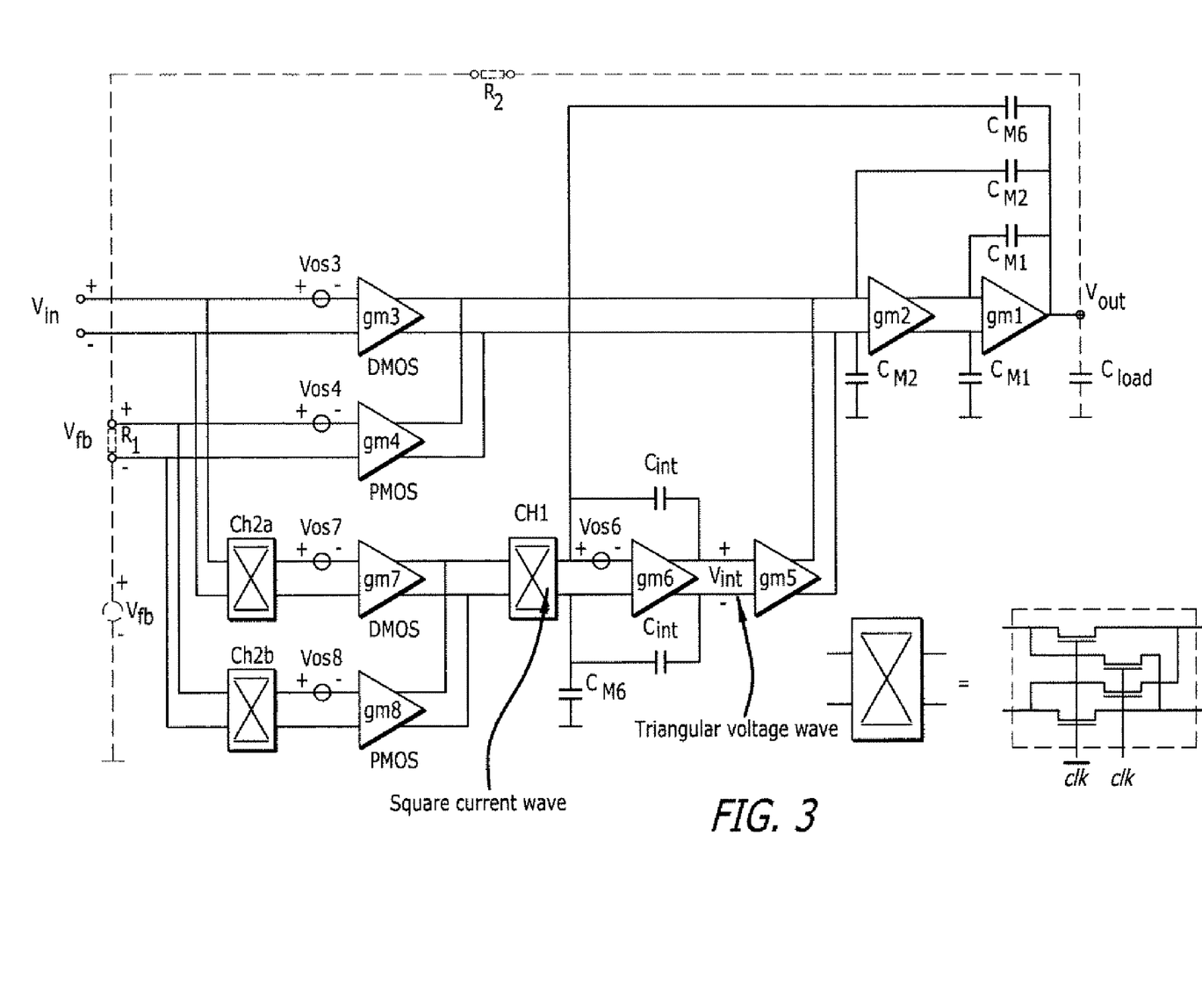
FIG. 3 illustrates a chopper stabilized version of a three stage amplifier which may incorporate the present invention.

A three stage amplifier topology is chosen as shown in FIG. 2 to achieve the high DC open loop gain needed for accuracy. A chopper stabilized version of a three stage amplifier is shown in FIG. 3.

To achieve a unity gain frequency of 1 MHz with a 100 pF load and a gain margin of 60°, the following exemplary values are chosen:

$$\frac{gm1}{2\pi C_{load}} = 4 \text{ MHz } gm1 = 2.5 \text{ mA/V}$$

$$\frac{gm2}{2\frac{1}{2}\pi C_{M1}} = 2 \text{ MHz } gm2 = 100 \text{ uA/V } Cm1 = 16 \text{ pF}$$

$$\frac{gm3}{2\frac{1}{2}\pi C_{M2}} = 1 \text{ MHz } gm3 = gm4 = 100 \text{ uA/V (noise restricted)}$$

Cm2=32 pF

First assume offsets $V_{os,eq} \approx V_{os3} + V_{os4} \approx 20$ mV, while Vos6, Vos7 and Vos8 are zero.

The integrator built around gm6 and Cint will integrate a current until Vfb=Vin, thus inducing a voltage Vint, which will induce a current through gm5 to compensate the error current caused by the offset sources Vos3 and Vos4. This assumed that gm7 and gm8 are equal.

If gm7 is not present, gm8 would charge the integrator until $V_{fb}=0$, and the output voltage would be approaching zero.

Another way to look at this circuit: The high voltage gain, low bandwidth amplifier gm7, 8; gm6; gm5; gm2; gm1 dominates at low frequencies and will therefore dominate the offset performance, while the lower voltage gain, high bandwidth path gm3, 4; gm2; gm1 will achieve the high bandwidth.

However Vos7 and Vos8 are not zero. The choppers will modulate these offsets, creating an offset-less amplifier for DC. The offsets will create square wave current at the input of the integrator gm6 and triangular wave voltage at the output gm6.

Assume Cint=32 pF gm7=gm8=25 uA/V gm5=2.5 uA/V which is 40 times lower than gm3,4. Thus the DC component of Vint will need to be 40 times higher than Vos3,4⇒0.8V in order to fully compensate the offset.

If Vos7,8=20 mV and the chopper frequency fc=16 kHz, then the top voltage of the triangular wave at Vint and Vfb (FIG. 3) would be:

$$V_{int-tt} = \frac{V_{os7,8}gm7,8}{2f_c C_{int}} = 1 \text{ V } V_{fb-tt} = \frac{V_{os7,8}gm7,8}{2f_c C_{int}} \frac{gm5}{gm4} = 25 \text{ mV}$$

A concern is that the output of gm6 can drive both the dc component to compensate Vos3 and Vos4, and the triangular wave. Moreover, the triangular wave will produce a ripple at the system output (clock noise), which is undesirable.

Figure 4A:
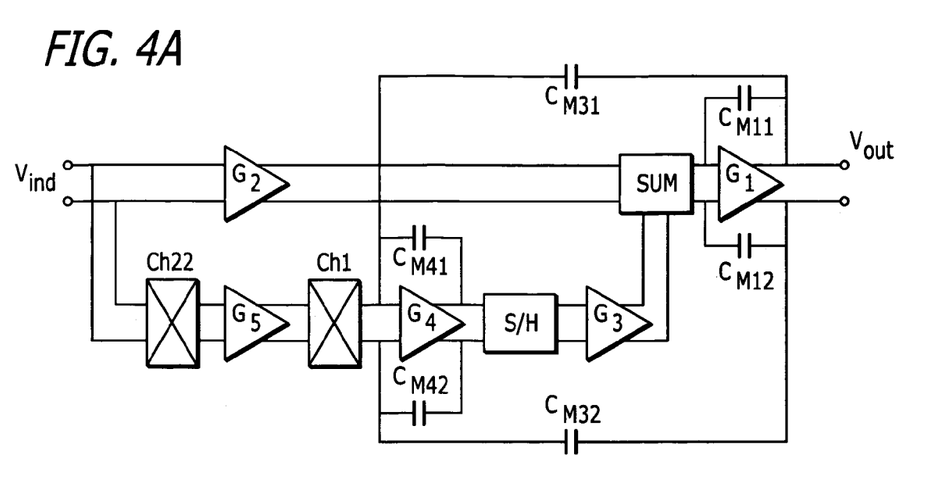
FIG. 4a illustrates the incorporation of a sample and hold function in the offset correction path of an operational amplifier.
Figure 4B:
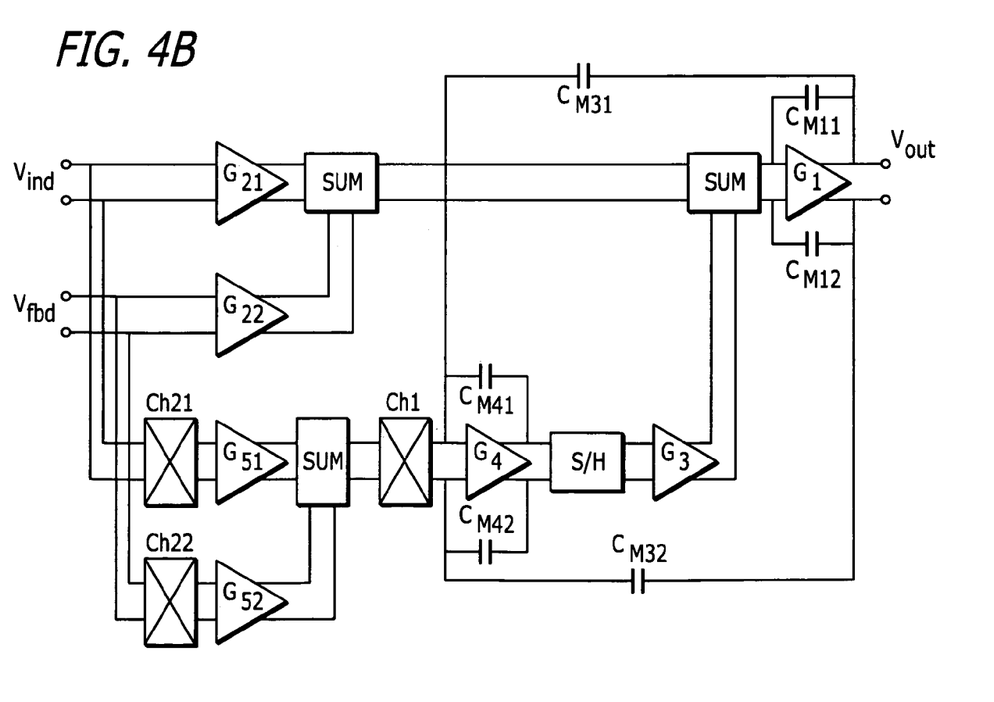
FIGS. 4b and 4c illustrate the incorporation of a sample and hold function in the offset correction path of an instrumentation amplifier.
Figure 4C:
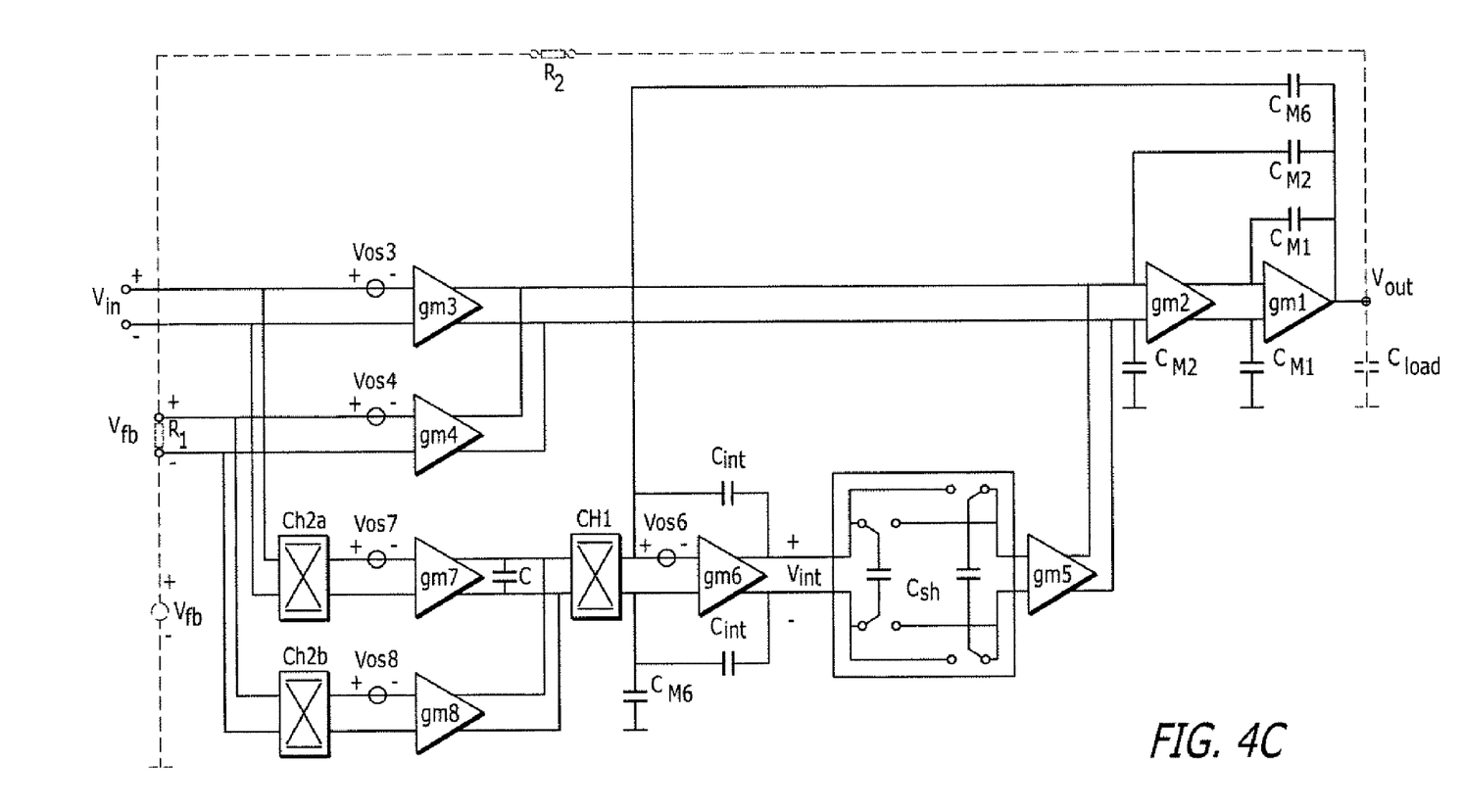

An important way to reduce this output ripple is:

To transform the residual triangular wave Vint to a signal in which there is no AC component. Implementing a sample and hold function behind the integrator in the offset correction loop as shown in FIG. 4a for an operational amplifier, and as shown in FIGS. 4b and 4c for an instrumentation amplifier can do this.

The capacitor CM6 (FIG. 4c) is implemented for frequency compensation. It is connected to the virtual ground input of the active integrator. The capacitor and active integrator are part of the frequency compensation topology in combination with choppers See U.S. Patent Application Publication No. 2006/0176108 entitled "Frequency Stabilization of Chopper-Stabilized Amplifiers", hereinbefore incorporated by reference and referred to here for frequency compensation techniques for eliminating the 12 dB roll-off at low frequencies of FIG. 5a to obtain the linear 6 dB roll-off of FIG. 5b.

The sample and hold circuit works closely together with this frequency-compensation topology to strongly reduce the clock ripple, while it does not destroy the straight 6 dB/oct rolloff under certain conditions. The following describes improvements on the circuits of FIG. 4.

If now Vos6≠0, and assume that there is a parasitic capacitance C at the output of gm7,8, this will induce a residual input offset voltage. This may be explained as follows.

Figures 5A, 5B, 6:
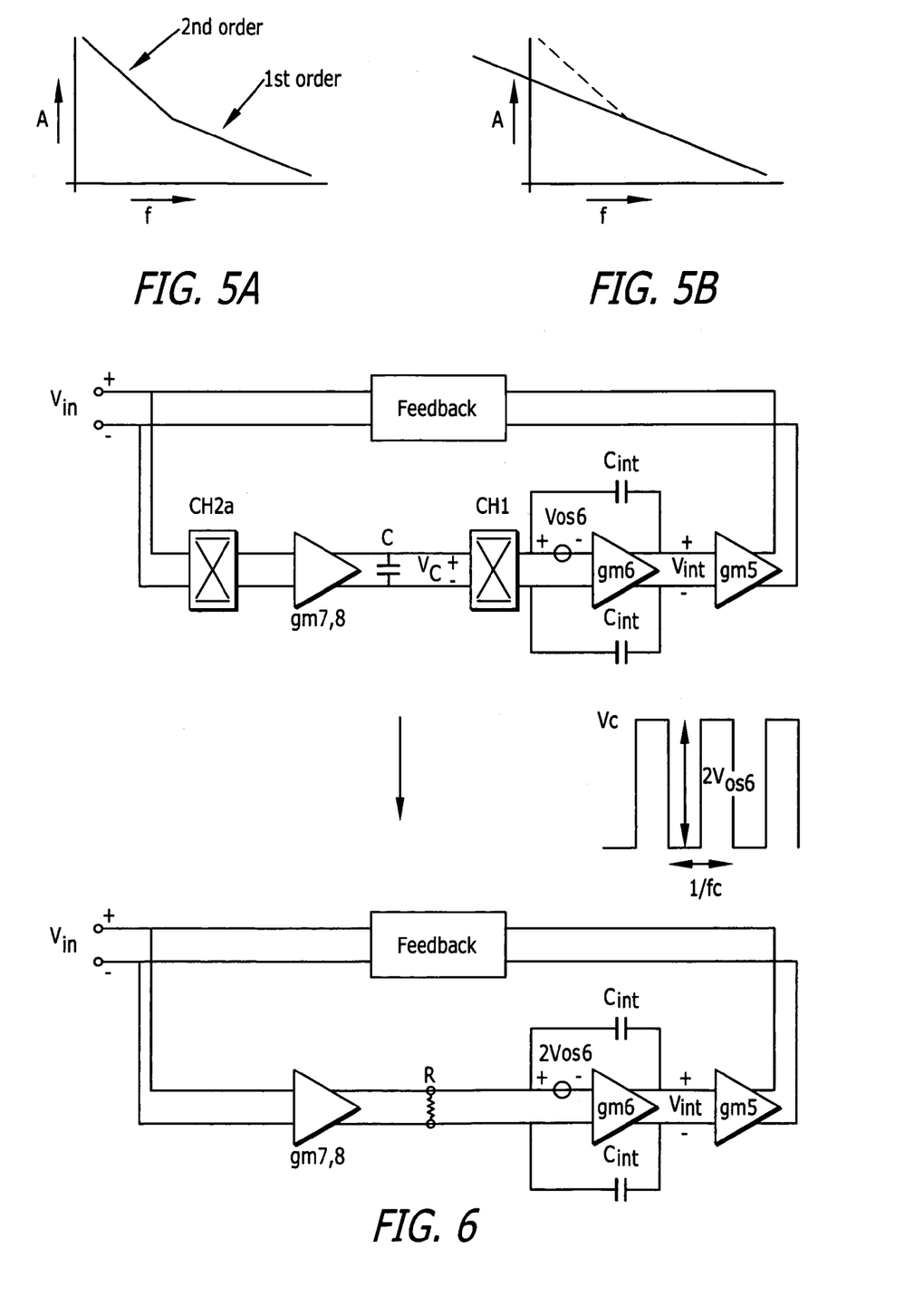

Assuming the parasitic capacitance C will be charged with + or −Vos6, resistor R of FIG. 6 can be viewed as a switched capacitor resistor, as follows:

$$R = \frac{1}{4f_c C}$$

Through this resistor a current $$I = \frac{2V_{os6}}{R}$$

will flow. The system now needs an equivalent input offset voltage to compensate for the capacitor current.

$$V_{in} = V_{off,eq} = \frac{2V_{os6}C}{gm7,8} 2f_c$$

If Vos6=10 mV, gm7,8=25 uA/V, fc=16 kHz and C=0.4 pF (optimistic guess), then Voff,eq=10.24 uV.

Conclusion: this must be corrected.

Which means making the parasitic C<0.4 pF by way of careful design and layout, making gm7 and gm8 larger and the chopper frequency lower, which would mean that the integrator cap should become larger, to accommodate the larger ripple.

A fundamentally better solution is to cancel Vos6. Therefore in preferred embodiments, an autozero around gm6 is implemented, as in FIG. 7a.

Figure 7A:
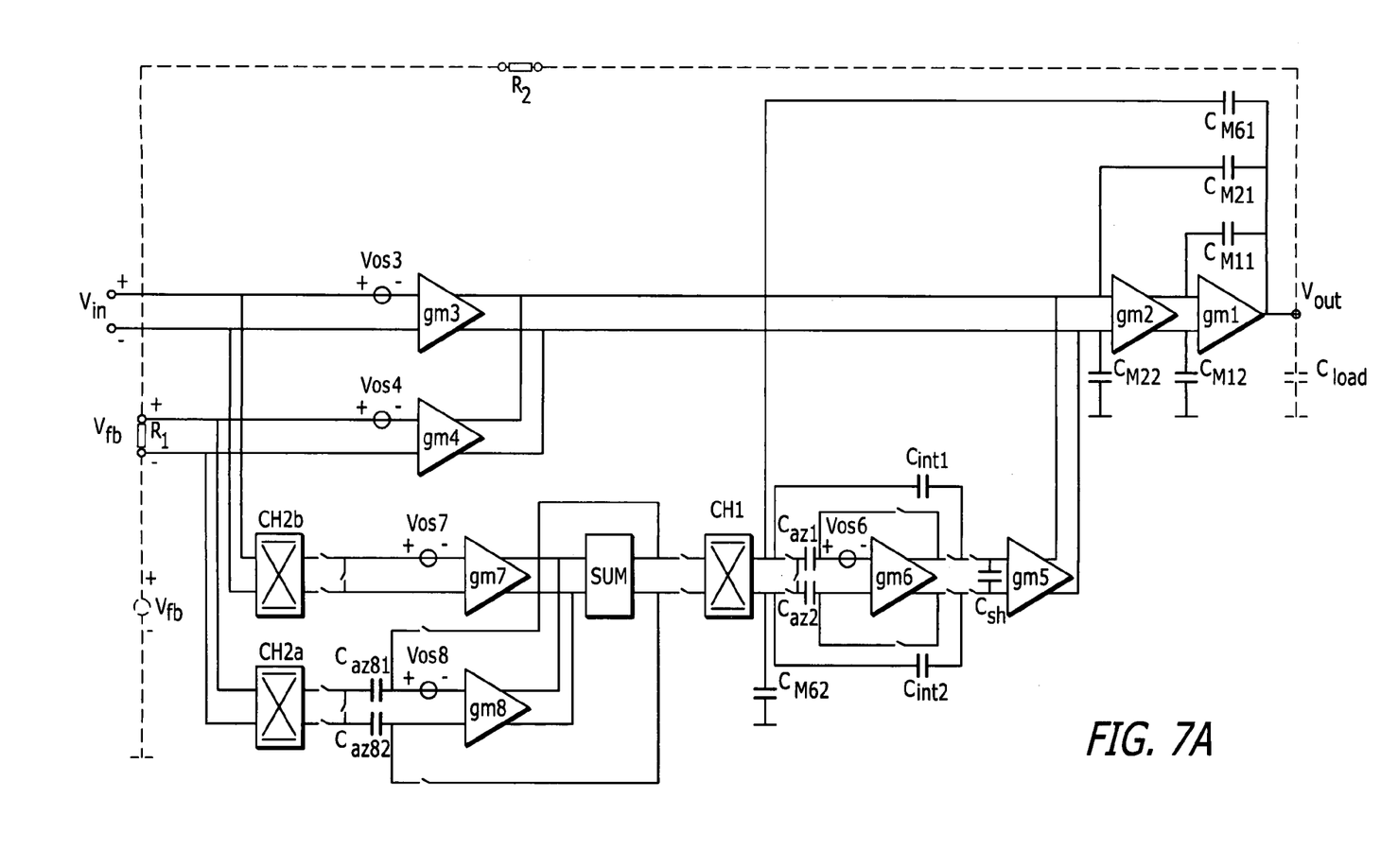
FIG. 7a illustrates the implementation of an autozero on the chopper amplifier and sample and hold in the correction path of an instrumentation amplifier.

In the instrumentation amplifier of FIG. 7a the functions of integration and autozeroing are combined around gm6. The sample and hold function is implemented before gm5 by Csh.

Another way to reduce the clock ripple is to autozero the chopper amplifiers gm7 and gm8. This is also shown in FIG. 7a. The autozeroing of the chopper amplifiers is optional, but desirable for best performance, as is the autozeroing of the integrator amplifier. In that regard, the sample and hold essentially eliminates the AC ripple at the chopper frequency, while the autozeroing improves the DC offset, separate parameters. Autozeroing of the chopper amplifiers is also a remedy against residual offset caused by clock skew, when the chopper clock does not have a 50% duty cycle.

Switches are shown in FIG. 7a for the sample and hold of the output of the integrator as well as for the autozeroing of the integrator amplifier gm6 and of the choppers CH2a and CH2b and CH1 around the chopper amplifiers gm7 and gm8.

The noise simulation of the exemplary embodiment is shown in FIGS. 8a through 8d.

The input transconductance amplifiers gm3, gm4, gm7 and gm8 may be in accordance with U.S. patent application Ser. No. 11/054,140 entitled "Accurate Voltage to Current Converters for Rail-Sensing Current-Feedback Instrumentation Amplifiers" filed on Feb. 8, 2005 and assigned to the assignee of the present invention, the disclosure of which is also hereby incorporated by reference.

Figure 7B:
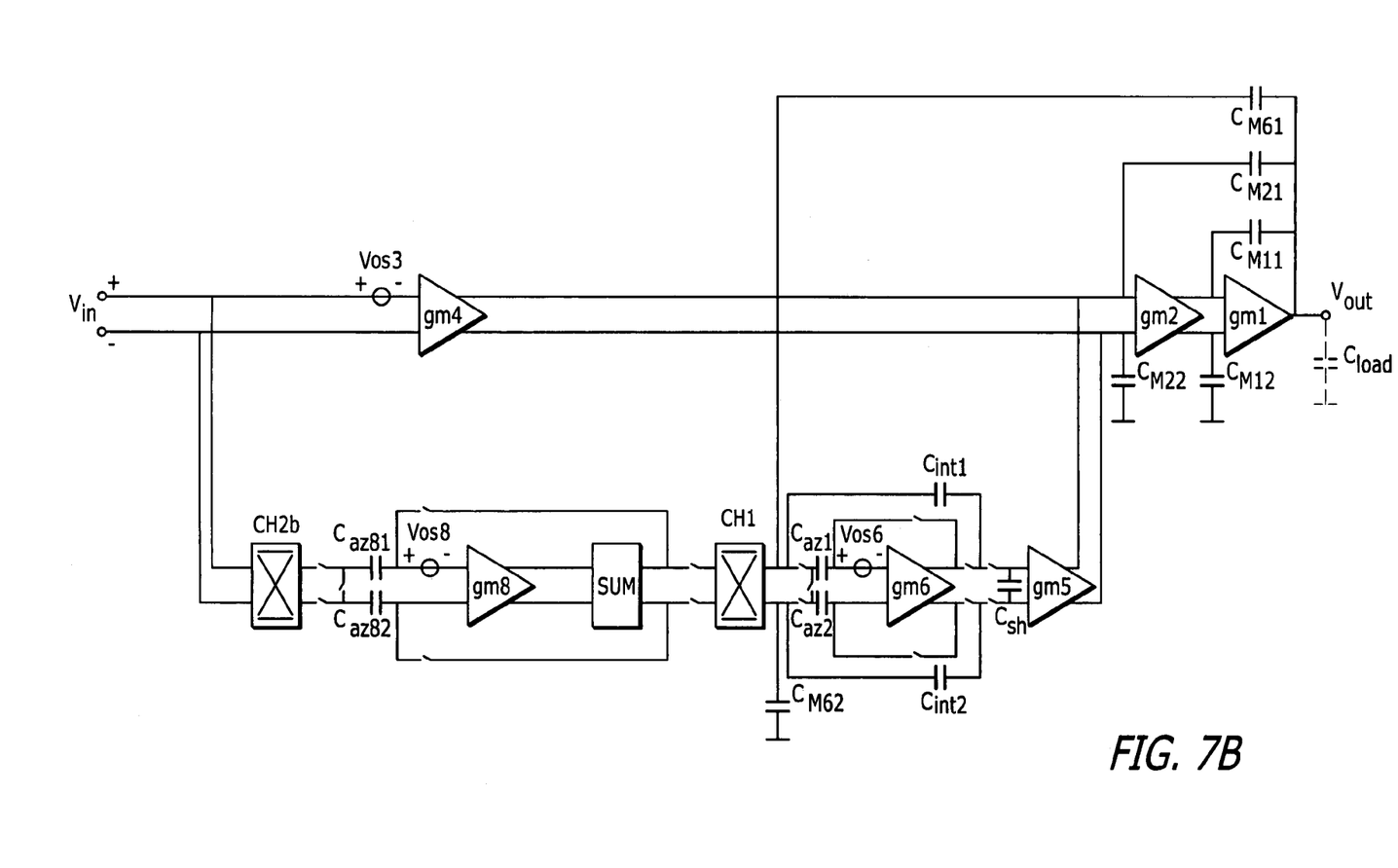
FIG. 7b illustrates the implementation of an autozero on the chopper amplifier and sample and hold in the correction path of an operational amplifier.
Figure 7C:
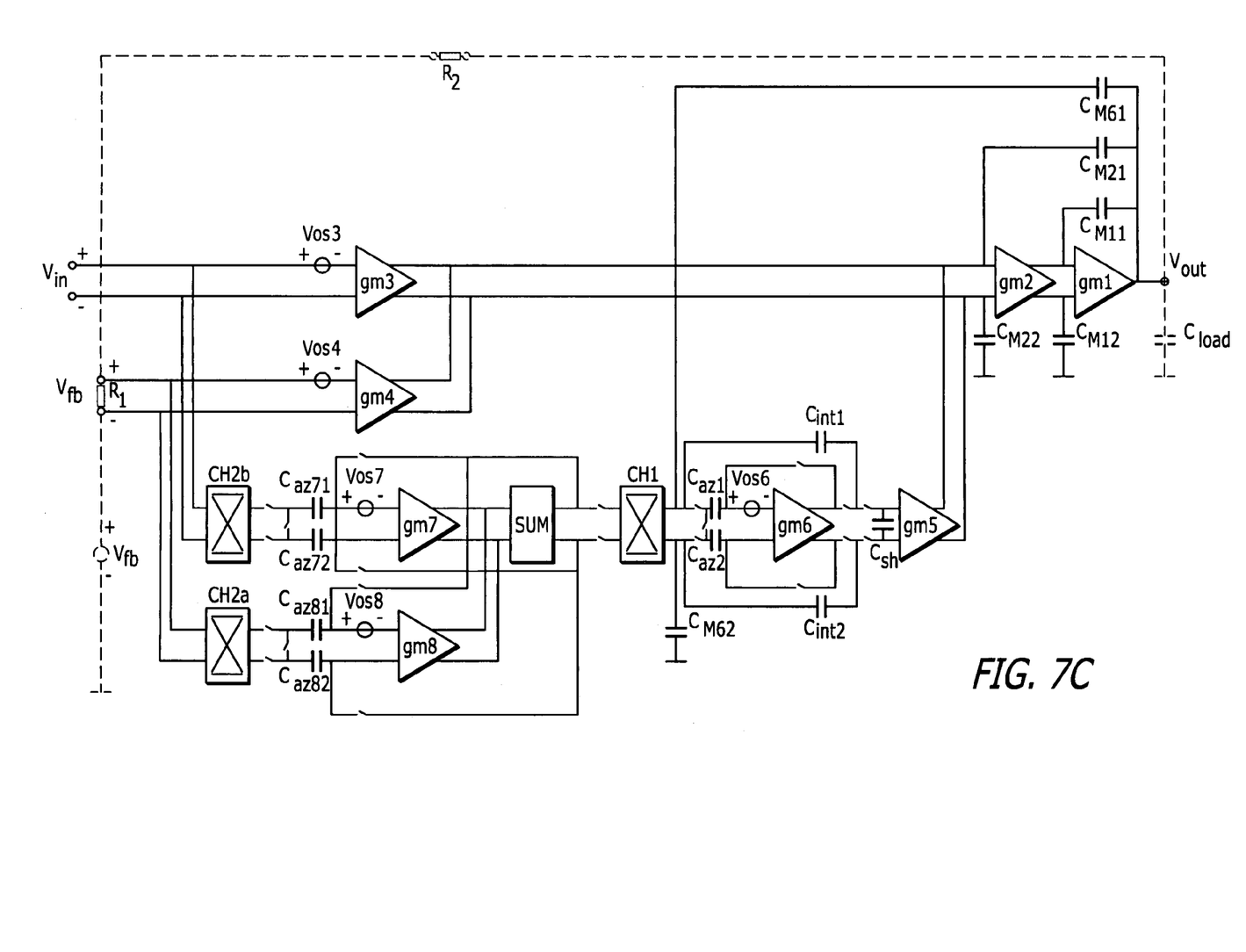
FIG. 7c illustrates an instrumentation amplifier similar to the instrumentation amplifier of FIG. 7a and incorporating additional coupling capacitors in the offset correction path.
Figure 8A:
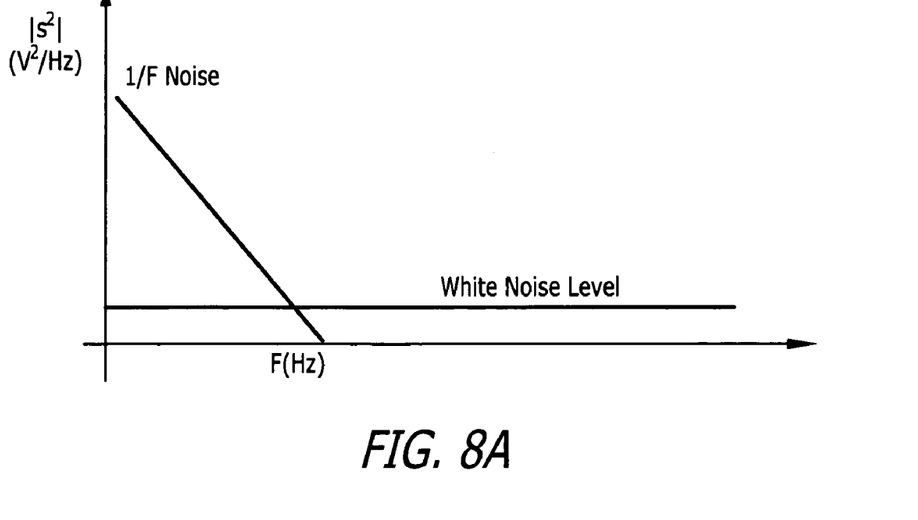
FIGS. 8a through 8d illustrate a noise simulation for an exemplary embodiment of the present invention.
Figure 8B:
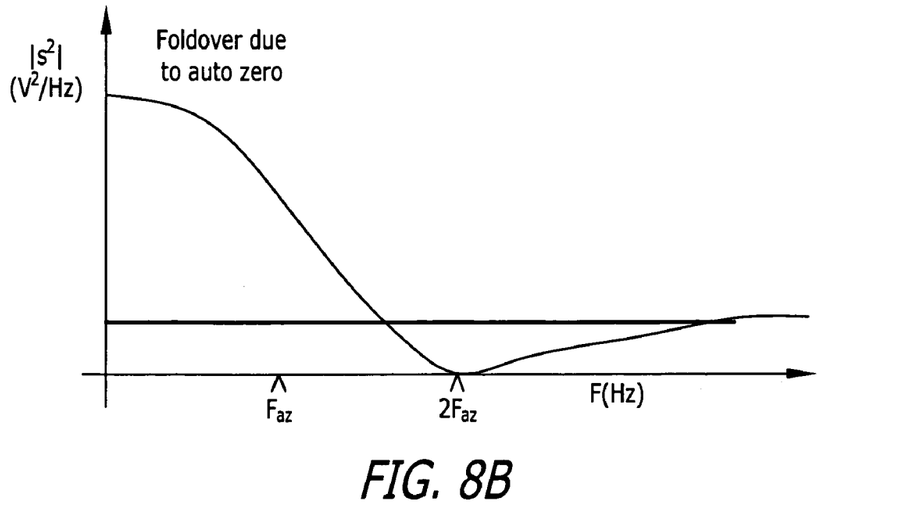
Figure 8C:
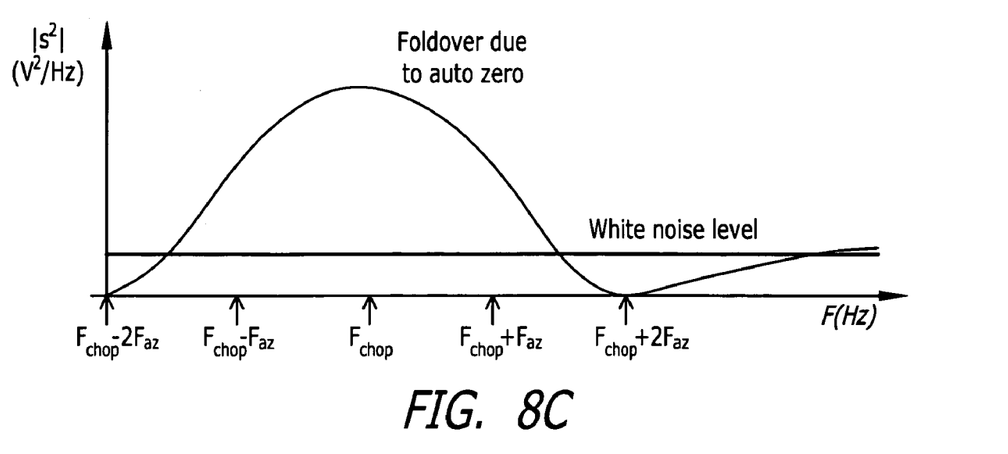
Figure 8D:
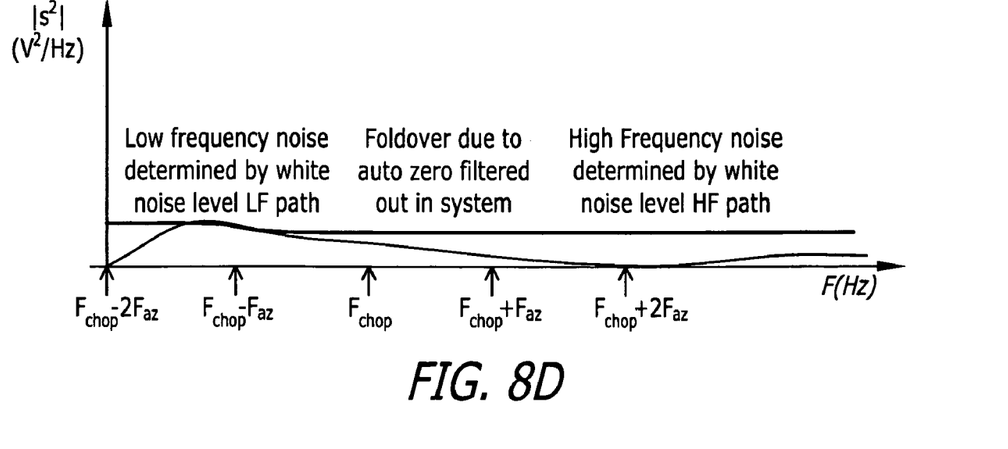

The performance of the instrumentation amplifier of FIG. 7a may be improved by adding additional coupling capacitors in the offset correction loop shown in FIG. 7c. In particular, while not shown, there will be some parasitic capacitance on the inputs to gm7 and gm8. Because in the circuit of FIG. 7a, gm8 has a capacitively coupled input (Caz81 and Caz82) and gm7 does not, this lack of symmetry will cause an error easily corrected by capacitively coupling the input to gm7 also, as shown in FIG. 7c. The addition of matching coupling capacitors Caz71 and Caz72 provides symmetry to eliminate this source of error, and otherwise does not effect the operation of the circuit.

For an operational amplifier, the circuit of FIG. 7a may be altered by the elimination of gm4, gm7 and the associated chopper CH2a and associated switches, as shown in FIG. 7b. Again the autozeroing of the chopper amplifier and the autozeroing of the integrator amplifier are optional.

Figure 9:
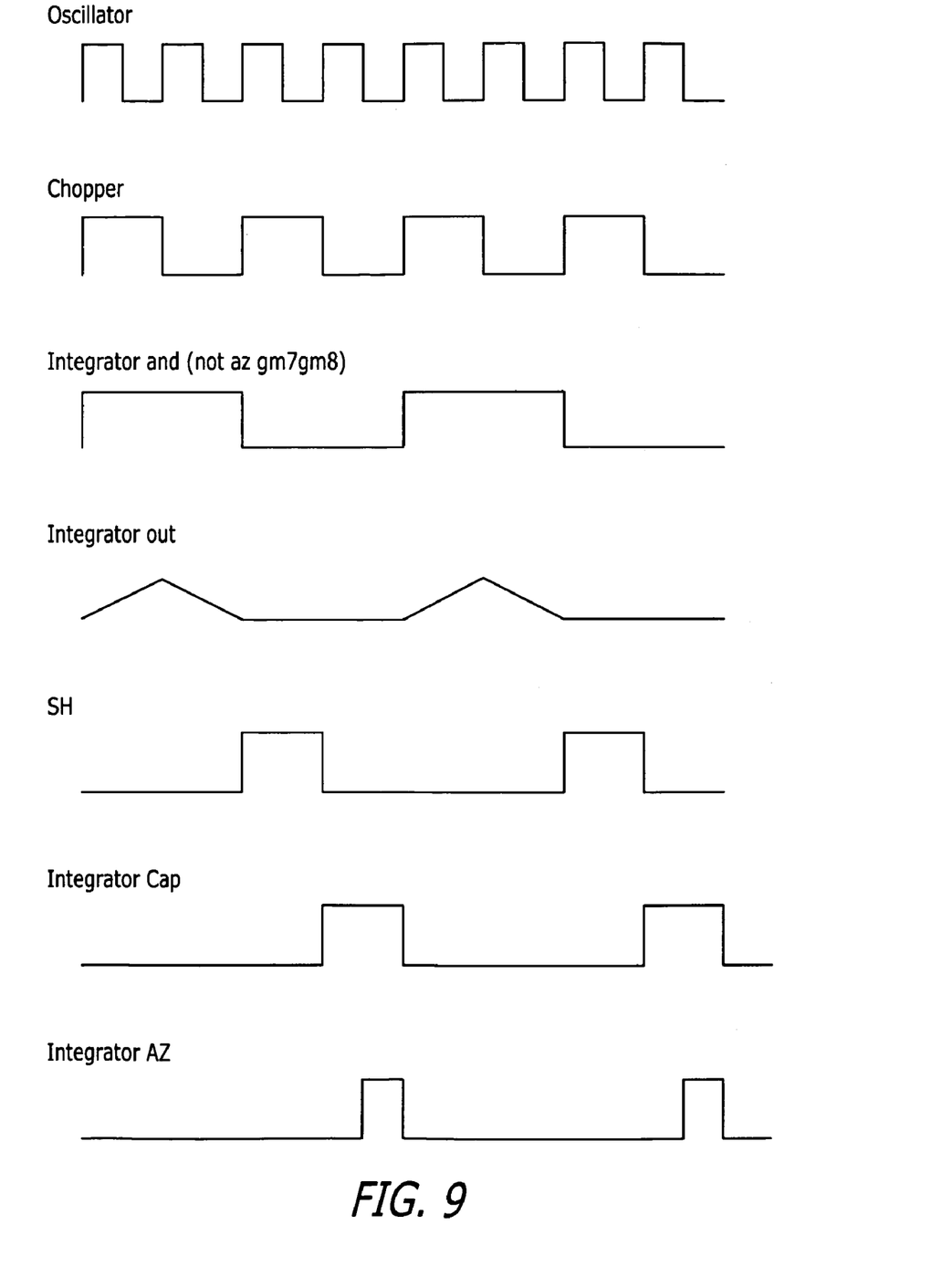

FIG. 9 is an exemplary timing diagram for the embodiment of FIG. 7a. The amplifier clock (oscillator) is divided by 2 to control the integrator, the integrator integrating when the integrator control is high, and having its input disconnected when low. The integrator, when integrating, will integrate the square wave output of the chopper over one full cycle of the chopper, giving the triangular wave form shown as Integrator out. During the next full chopper cycle, the integrator input is disconnected, so the integrator output does not change. At the end of each integration, the sample and hold (SH) is clocked, storing the output of the integrator on the holding capacitor SH. Then the integrator capacitors are disconnected from the output of the integrator (Integrator Cap high), after which the integrator amplifier gm6 is autozeroed. The chopper amplifiers CH2a and CH2b are autozeroed when the integrator is not integrating, namely on the inverse of the integrator control ("not as gm7 gm8").

Figure 10:
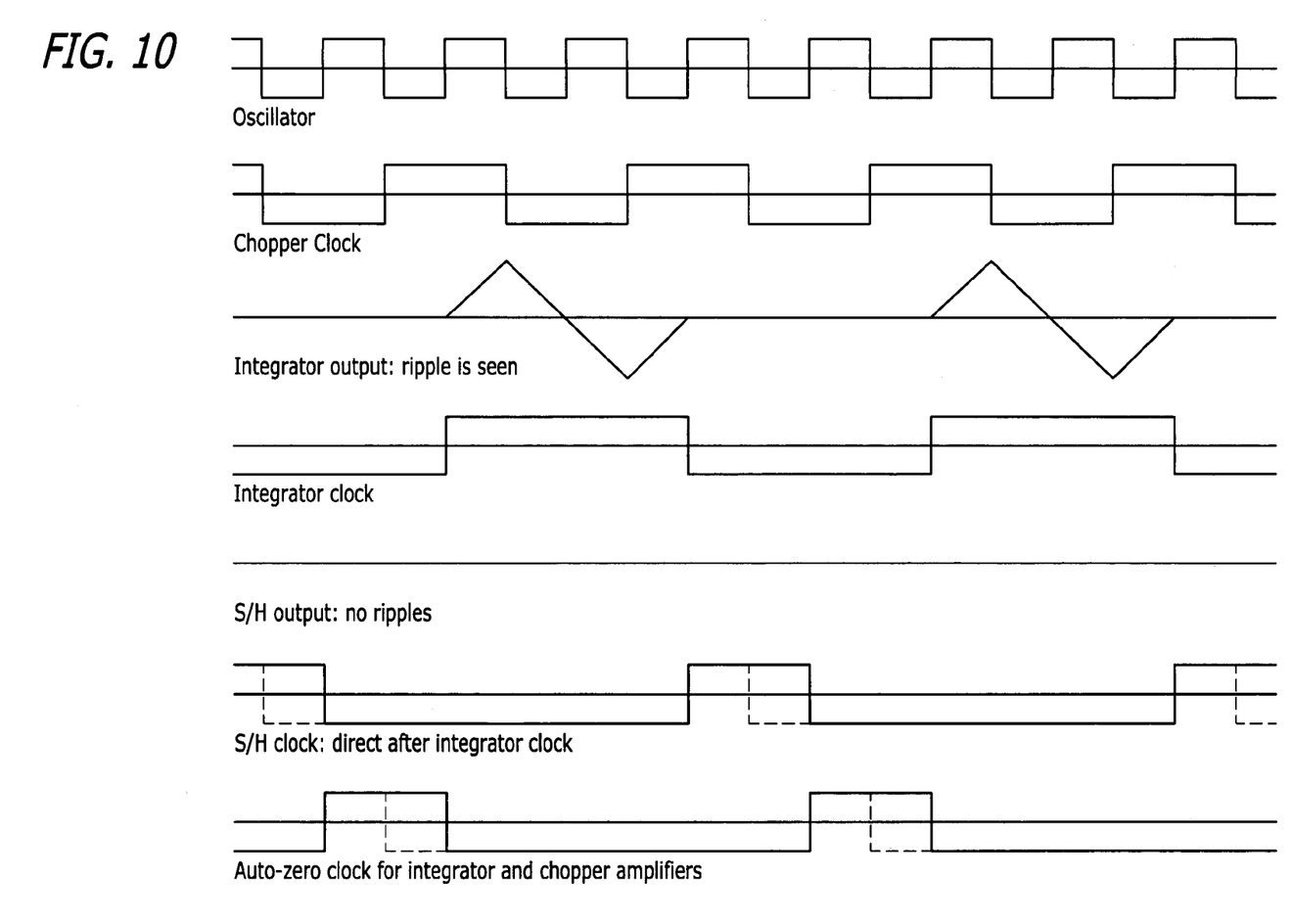
FIG. 10 illustrates one alternate timing diagram.

The timing diagram of FIG. 9 is exemplary only, as there are many alternatives that may be used. By way of example, FIG. 10 shows an alternate timing diagram. The main difference in this diagram is that the integrator clock starts in the middle of the chopper clock, resulting in a different integrator output waveform. Also delays may be imposed between clocks as desired to avoid any undesirable influence between successive operations.

In the present invention, the insertion of the sample and hold will cause an additional time delay Tsh in the chopper loop, which is inversely equal to the sample frequency fsh: Tsh=1/fsh. This delay can easily result in a non-linear roll-off of the frequency characteristic, or can even cause instability of the feedback system. This non-linearity or instability will not occur if the sample and hold has been inserted directly after the integrator, as shown in FIGS. 4 and 7a and 7b, and if the sample and hold clock frequency fsh is on the order of 4 times larger than the frequency fAchp0 at which the chopper path loop gain is 0 dB: Achp=(Gm7/ωC6)(Gm5/Gm3,4)=1. In this case, the sample and hold adds a 45 degree phase delay to the chopper loop, which is satisfactory. The loop will be unstable when the additional phase is more than 90 degrees at a sample frequency fsh lower than 2 times the frequency fAchp0 at which the chopper loop gain is 0 dB.

While certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. An amplifier circuit having a circuit input and an circuit output, comprising:
   first and second amplifiers cascaded together, each having an input and an output, the circuit input being coupled to the input of the first amplifier and the circuit output being coupled to the output of the second amplifier;
   a first chopper having an input coupled to the circuit input and an output coupled to an input of a third amplifier, an output of the third amplifier being coupled to an input of a second chopper, the second chopper having an output coupled to a fourth amplifier coupled as an integrator with capacitive feedback, an output of the integrator being coupled to a sample and hold circuit, an output of the sample and hold circuit being coupled to an input of a fifth amplifier, an output of the fifth amplifier being coupled to combine with the output of the first amplifier as the input coupled to the second amplifier;
   one or more first compensation capacitors coupled between the output of the second amplifier and the input of the second amplifier; and,
   one or more second compensation capacitors coupled between the output of the second amplifier and the input to the integrator.

2. The amplifier of claim 1 wherein the second amplifier comprises a pair amplifiers cascaded together, and further comprising one or more third compensation capacitors coupled between the output of the second amplifier and the connection cascading the pair of amplifiers together.

3. The amplifier of claim 1 further comprised of an autozeroing circuit coupled to the third amplifier.

4. The amplifier of claim 3 further comprised of an autozeroing circuit coupled to the fourth amplifier.

5. The amplifier of claim 1 further comprised of an autozeroing circuit coupled to the fourth amplifier.

6. The amplifier of claim 1 wherein the amplifiers and capacitors are chosen to provide an amplifier circuit frequency response that is flat for low frequencies, and which rolls off at 6 dB per octave above the low frequencies.

7. The amplifier of claim 1 further comprising:
   a third chopper coupled to receive a feedback responsive to the output of the second amplifier;
   a sixth amplifier having an input coupled to output of the third chopper and an output coupled to combine with the output of the third amplifier as the input coupled to the second chopper; and
   a seventh amplifier coupled to receive the feedback responsive to the output of the second amplifier and having an output coupled to combine with the output of the first amplifier.

8. The amplifier of claim 7 wherein the second amplifier comprises a pair amplifiers cascaded together, and further comprising one or more third compensation capacitors coupled between the output of the second amplifier and the connection cascading the pair of amplifiers together.

9. The amplifier of claim 7 further comprised of an autozeroing circuit coupled to the fourth amplifier.

10. The amplifier of claim 9 further comprised of an autozeroing circuit coupled to the third and sixth amplifiers.

11. The amplifier of claim 10 wherein the autozeroing circuit coupled to the third and sixth amplifiers includes matching autozeroing storage capacitors in series with the inputs to the third and sixth amplifiers.

12. The amplifier of claim 7 wherein the amplifiers and capacitors are chosen to provide an amplifier circuit frequency response that is flat for low frequencies, and which rolls off at 6 dB per octave above the low frequencies.

13. A method of reducing output offset and noise in the output of an amplifier circuit having an input and an output comprising:
provichild a plurality of cascaded amplifiers coupled between the amplifier circuit input and amplifier circuit output,
amplifying the amplifier circuit input with a first chopper stabilized amplifier;
integrating an output of the first chopper stabilized amplifier;
sampling and holding an output of the integrator with a sample and hold circuit; and,
coupling a signal responsive to a signal held by the sample and hold circuit to the cascaded amplifiers after at least one stage of amplification by the cascaded amplifiers.

14. The method of claim 13 wherein a signal held by the sample and hold circuit is amplified or attenuated before being coupled to the cascaded amplifiers.

15. The method of claim 13 wherein the output of the first chopper stabilized amplifier is integrated over alternate full chopper cycles, and the sampling and holding of the output of the integrator occurs between the alternate full chopper cycles when the integrator is not integrating.

16. The method of claim 15 wherein an integrator amplifier and the first chopper stabilized amplifier are autozeroed between the alternate full chopper cycles when the integrator is not integrating and after the sampling and holding.

17. The method of claim 13 further comprising amplifying a feedback signal responsive to an output of the amplifier circuit and coupling the amplified feedback signal to the cascaded amplifiers after at least one stage of amplification, and amplifying the feedback signal with a second chopper stabilized amplifier and combining the amplified feedback signal with the output of the chopper first stabilized amplifier.

18. The method of claim 17 wherein a signal held by the sample and hold circuit is amplified before being coupled to the cascaded amplifiers.

19. The method of claim 17 wherein the combined output of the first and second chopper stabilized amplifiers is integrated over alternate full chopper cycles, and the sampling and holding of the output of the integrator occurs between the alternate full chopper cycles when the integrator is not integrating.

20. The method of claim 19 wherein an integrator amplifier and the first and second chopper stabilized amplifiers are autozeroed between the alternate full chopper cycles when the integrator is not integrating and after the sampling and holding.

21. The method of claim 19 wherein the inputs to the first and second chopper stabilized amplifiers are capacitively coupled inputs.

* * * * *

UNITED STATES PATENT AND TRADEMARK OFFICE
CERTIFICATE OF CORRECTION

PATENT NO. : 7,535,295 B1
APPLICATION NO. : 11/855461
DATED : May 19, 2009
INVENTOR(S) : John Hendrik Huijsing et al.

It is certified that error appears in the above-identified patent and that said Letters Patent is hereby corrected as shown below:

Please delete Drawing Sheet 2 of 12 and substitute the attached Drawing Sheet 2 of 12.

Please delete Drawing Sheet 4 of 12 and substitute the attached Drawing Sheet 4 of 12.

Signed and Sealed this

Fourth Day of August, 2009

JOHN DOLL
*Acting Director of the United States Patent and Trademark Office*

FIG. 3

FIG. 4C